(12) United States Patent
Ozbay et al.

(10) Patent No.: US 10,079,057 B2
(45) Date of Patent: Sep. 18, 2018

(54) 3D MAGNETIC MEMORY DEVICE BASED ON PURE SPIN CURRENTS

(71) Applicants: Gokce Ozbay, Istanbul (TR); Ozhan Ozatay, Istanbul (TR)

(72) Inventors: Gokce Ozbay, Istanbul (TR); Ozhan Ozatay, Istanbul (TR)

(*) Notice: Subject to any disclaimer, the term of this patent is extended or adjusted under 35 U.S.C. 154(b) by 0 days.

(21) Appl. No.: 15/782,854

(22) Filed: Oct. 13, 2017

(65) Prior Publication Data

US 2018/0122460 A1 May 3, 2018

(30) Foreign Application Priority Data

Oct. 31, 2016 (TR) .............................. a 2016 15482

(51) Int. Cl.
*G11C 11/30* (2006.01)
*G11C 11/56* (2006.01)
*G11C 11/16* (2006.01)
*H01L 43/04* (2006.01)
*H01L 43/10* (2006.01)
*H01L 43/14* (2006.01)
*B82Y 25/00* (2011.01)
*B82Y 10/00* (2011.01)

(52) U.S. Cl.
CPC ...... *G11C 11/5607* (2013.01); *G11C 11/1655* (2013.01); *H01L 43/04* (2013.01); *H01L 43/10* (2013.01); *H01L 43/14* (2013.01); *B82Y 10/00* (2013.01); *B82Y 25/00* (2013.01)

(58) Field of Classification Search
CPC .................................................. G11C 11/00
USPC .................................................. 365/130, 148
See application file for complete search history.

(56) References Cited

U.S. PATENT DOCUMENTS

| | | |
|---|---|---|
| 6,693,826 B1 | 2/2004 | Black, Jr. et al. |
| 7,551,469 B1 | 6/2009 | Parkin |
| 8,164,940 B2 | 4/2012 | Ozatay et al. |
| 8,295,006 B2 | 10/2012 | Sugano et al. |
| 8,422,284 B2 | 4/2013 | Folks et al. |
| 9,105,832 B2 | 8/2015 | Buhrman et al. |
| 2008/0278994 A1* | 11/2008 | Katti ............ G11C 11/5607 365/158 |

FOREIGN PATENT DOCUMENTS

WO WO2005119689 A1 12/2005
WO WO2014102728 A1 7/2014

OTHER PUBLICATIONS

J. S. Meena et al. "Overview of emerging nonvolatile memory technologies", Nanoscale Res. Lett. 9, 526 (2014).

(Continued)

*Primary Examiner* — Hoai V Ho
(74) *Attorney, Agent, or Firm* — Gokalp Bayramoglu (57) ABSTRACT

The invention relates to a three dimensional magnetic memory device (1) employing pure spin currents to write information into magnetic bits. The magnetic memory device (1) is formed of one or more stack of two storage layers (13) placed between two reference layers (9). The stacks are connected to each other through common reference electrodes (12) formed by connecting reference electrodes (11) placed on bottom of a first stack and on top of the second stack positioned under the first stack.

20 Claims, 5 Drawing Sheets

(56) References Cited

OTHER PUBLICATIONS

O. Ozatay et al. "Spin-Based Data Storage". in Compr. Nanosci. Technol. (Elsevier, 2011).
L. Liu et al, "Spin-Torque Switching with the Giant Spin Hall Effect of Tantalum", Science 336, 555 (2012).
V. E. Demidov et al. "Magnetic nano-oscillator driven by pure spin current", Nat. Mater. 11, 1028 (2012).
V. E. Demidov et al. "Spin-current nano-oscillator based on nonlocal spin injection", Sci. Rep. 5, 8578 (2015).
A. Hoffmann, "Make your Spins Spin", Physics 6, (2013).

\* cited by examiner

3D MAGNETIC MEMORY DEVICE BASED ON PURE SPIN CURRENTS

CROSS REFERENCE TO RELATED APPLICATIONS

This application is based upon and claims priority to Turkish Patent Application No. 2016/15482, filed on Oct. 31, 2016, the entire contents of which are incorporated herein by reference.

FIELD OF THE INVENTION

The present invention relates to 3D magnetic memory devices.

BACKGROUND OF THE INVENTION

Today, data storage technology is based on three main physical characteristics of materials, namely electrical, optical and magnetic. Flash memory based on the principle of charge storing in a simple capacitor, DVD coded with the change of reflectivity in optical wavelengths, hard disc coding data with regional orientation of magnetic thin films can be given as examples. Even though these technologies are used commonly, they have physical limitations specific to themselves in terms of scalability which is a precondition for the increase in data storage density. New and emerging technologies are considered for high density, low power consumption devices especially for use with battery operated mobile devices. Low manufacturing costs and high read/write speeds also drive the research towards an optimal memory device that can replace or can be used with current technologies. Even though there are strong alternatives such as Phase-Change Memory (PCM) and magnetic-random access memory (MRAM), search for denser, faster and power efficient devices still continues [1,2].

Recent developments in spintronics research gave way to a variety of inventions in magnetic recording which offer Non-Volatile (NV) storage capability and durability. Current technology, the magnetic hard disc drive, is limited in scalability due to the super-paramagnetic effect (limits the cell size) and is bound to moving components to store and read information such as rotating discs and moving read/write-heads which increase the device size and consume too much power. Utilization of spin polarized electrons in spin-transfer—torque MRAMs or STT-RAMs overcomes the problem of high power consumption by switching the magnetization of the bits via spin polarized currents which eliminates the need for moving parts. The scalability issue in magnetic memory can be addressed by utilization of the third dimension in three-dimensional (3D) memory structures which either consist of layers of magnetic information [3] or make use of the volume inside the memory as in racetrack memory design [4]. Such memory devices utilize spin transfer torque [5], heat assisted stray field induced magnetization switching [6], opto-magnetic methods [7].

Disadvantages of known memory devices can be summarized as follows;

Current memory technologies such as flash memory, DVD and hard disc drives are limited in scalability and fall short in answering the demand for higher storage capacities. These memory types face issues as they are scaled down such as charge leakage in Flash memory cells, wavelength limit in DVDs and superparamagnetic effect in hard disc drives.

Moving parts inside the memory devices also limits the size, consume too much power and can malfunction causing mechanical problems.

Current technologies have read/write times on the order of milli-micro seconds. In discs with moving parts, the speed is limited by the rotation speed and/or the speed of read/write heads.

Some of the current memory technologies such as DRAM are volatile. Therefore they require power consumption to refresh the memory.

Long term stability of the binary states is an issue for some technologies such as PCM.

The requirement of separate reader/writer/buffer units not only complicate the device structure, but also increase the manufacturing costs in some technologies such as hard-disc drives. In some emerging three dimensional (3D) memory technologies such as race-track memory and opto-magnetic memory bit transfer is required in order to read which increases the error rate and costs extra time.

So a novel 3D non-volatile memory design with ultra-high density, no moving parts, individual bit access hence nano-second read/write times, stable logic states and reduced manufacturing costs by incorporating reader and writer units into the design is needed.

REFERENCES

[1] J. S. Meena, S. M. Sze, U. Chand, and T.-Y. Iseng, Nanoscale Res. Lett. 9, 526 (2014).
[2] O. Ozatay, P. G. Mather, T. Hauet, J.-U. Thiele, and P. M. Braganca, in Compr. Nanosci. Technol. (Elsevier, 2010).
[3] Robert A. Buhrman, L. Liu, D. C. Ralph, and C.-F. Pai, U.S. Pat. No. 9,105,832B2 (21 Feb. 2013).
[4] S. S. P. Parkin, U.S. Pat. No. 7,551,469 B1 (23 Jun. 2009).
[5] L. Folks and B. D. Terris, U.S. Pat. No. 8,422,284 B2 (16 Apr. 2013).
[6] O. Ozatay and B. D. Terris, U.S. Pat. No. 8,164,940 B2 (24 Apr. 2012).
[7] Y. B. Kalyoncu and O. Ozatay, WO 2014102728 A1 (3 Jul. 2014).
[8] L. Liu, C.-F. Pais Y. Li, H. W. Tseng, D. C. Ralph, and R. A. Buhrman, Science 336, 555 (2012).
[9] V. E. Demidov, S. Urazhdin, H. Ulrichs, V. Tiberkevich, A. Slavin, D. Baither, G. Schmitz, and S. O. Demokritov, Nat. Mater. 11, 1028 (2012).
[10] V. E. Demidov, S. Urazhdin, A. Zholud, A. V. Sadovnikov, A. N. Slavin, and S. O. Demokritov, Sci. Rep. 5, 8578 (2015).
[11] A. Hoffmann, Physics 6, (2013).
[12] William C. Black, Jr., Ruili (Linda) Zhang, U.S. Pat. No. 6,693,826B1 (17 Feb. 2004).
[13] Manish Sharma, Frederick A. Perner, WO2005119689A1 (6 Sep. 2005).
[14] Ryoko Sugano, Masahiko Ichimura, Hiromasa Takahashi, U.S. Pat. No. 8,295,006B2 (23 Oct. 2012).

SUMMARY

Objects of the Invention

Spin injection into ferromagnets via either Spin Hall Effect (SHE) or spin diffusion through a non-magnetic layer has gained increased interest over the past couple of years with potential applications in magnetic memory devices [8] and on-chip oscillators [9, 10]. An advantage of using pure spin currents instead of charge currents is that one can benefit from multiple scattering events providing an efficient means of transferring spin angular momentum [11].

The object of the invention is to provide a 3D magnetic memory device based on pure spin currents. More specifically, the present invention is a magnetic memory device that aims to employ pure spin currents to write information into magnetic bits via nano-second current pulses, enabling ultra-fast write speeds. In the three-dimensional memory design, magnetic bits that are nano-scale magnetic pillars are arranged in arrays and stacked in layers hence the volume of the magnetic disc is utilized.

In the preferred embodiment of the present invention, the magnetic memory device is formed of at least one stack of two storage layers placed between two reference layers. In other words, the magnetic memory device comprising a plurality of stacks each of which comprise a first reference layer, a first storage layer, a second storage layer and a second reference layer disposed from above to below respectively, wherein; the first reference layer includes a plurality of arrays of magnetic reference bits, and a plurality of reference electrodes disposed on top of the arrays of the magnetic reference bits; the first storage layer includes a plurality of arrays of magnetic storage bits perpendicular to the arrays of the magnetic reference bits in the first reference layer, a plurality of arrays of writing metal electrodes positioned between the first reference layer and the first storage layer, and a plurality of arrays of reading metal electrodes in contact with the arrays of the magnetic storage bits in the first storage layer and the second storage layer; the second storage layer includes a plurality of arrays of magnetic storage bits in parallel to the arrays of the magnetic storage bits in the first storage layer; a plurality of arrays of writing metal electrodes positioned between the second storage layer and the second reference layer, and the second reference layer includes a plurality of arrays of magnetic reference bits perpendicular to the arrays of the magnetic storage bits in the second storage layer, and a plurality of arrays of reference electrodes on bottom of the arrays of the magnetic reference bits.

In one embodiment of the present invention, a plurality of the stacks disclosed above are overlapped on each other to form a structure with multiple stacks of two storage layers and each mentioned stacks are insulated by a non-magnetic insulation material.

In another embodiment of the present invention, a plurality of the stacks disclosed above are connected to each other through arrays of common reference electrodes formed by connecting the reference electrodes in two adjacent stacks. In this embodiment, adjacent reference layers in the connected stacks can be initialized via control box by passing a current pulse through the common reference electrodes.

The invention has several advantages over the previous memory systems:
- The information is stored in multiple layers of magnetic bit arrays; hence it is superior in terms of storage capacity.
- It is a non-volatile memory technology; i.e. information is reserved even in the absence of electrical power.
- Bit transfer utilizing torque from pure spin currents is more efficient with the additive effect of multiple spin scattering events and gives way to efficient power consumption.
- The invention utilizes nano-second current pulses to write and read information; therefore it does not rely on moving parts for operation. This saves time, energy and space.

The current invention allows access to individual bits and does not require neither a separate reader/writer unit nor a buffer stack. This is a great advantage in terms of reducing the manufacturing costs, more efficient use of space and at the same time reduced power consumption.

BRIEF DESCRIPTION OF DRAWINGS

The 3D magnetic memory device in order to fulfill the objects of the present invention is illustrated in the attached figures, where.

Elements shown in the figures are numbered as follows:
1. Magnetic Memory Device
2. Magnetic reference bit
3. Magnetic storage bit
4. Heavy metal electrode layer
5. Bottom layer
6. Intermediate layer
7. Top layer
8. Metal electrode layer
9. Reference layer
10. Insulation material
11. Reference electrode
12. Common reference electrode
13. Storage layer
14. Writing metal electrode
15. Reading metal electrode
16. Control box
I. Current
s− Electrons with spin along −y direction
s+ Electrons with spins along +y direction

DETAILED DESCRIPTION OF THE INVENTION

A three dimensional magnetic memory device (1), comprising;
a plurality of magnetic reference bits (2) formed of magnetic nano-pillars each of which is capped with a high spin-hall angle heavy metal electrode layer (4) and comprising a bottom layer (5) of high spin polarization ferromagnetic material in contact with an intermediate layer (6) of soft ferromagnet capped with a top layer (7) of high spin polarization ferromagnetic material;
a plurality of magnetic storage bits (3) formed of magnetic nano-pillars in sub-micron dimensions, each of which is capped with a long spin-diffusion length metal electrode layer (8) and comprising a bottom layer (5) of high spin polarization ferromagnetic material in contact with an intermediate layer (6) of soft ferromagnet capped with a top layer (7) of high spin polarization ferromagnetic material;

at least one stack of two storage layers (13) placed between two reference layers (9), wherein the reference layers (9) comprising;

a plurality of arrays of the magnetic reference bits (2) where the magnetic reference bits (2) are isolated by insulation materials (10) from each other;

a plurality of arrays of reference electrodes (11) in contact with the arrays of the magnetic reference bits (2);

the storage layers (13) comprising;

a plurality of arrays of the magnetic storage bits (3) perpendicular to the arrays of the magnetic reference bits (2), where the magnetic storage bits (3) are isolated by insulation materials (10) from each other, a plurality of arrays of writing metal electrodes (14) positioned between the reference layers (9) and storage layers (13);

a plurality of arrays of reading metal electrodes (15) in contact with the arrays of the magnetic storage bits (3).

Figure 1:
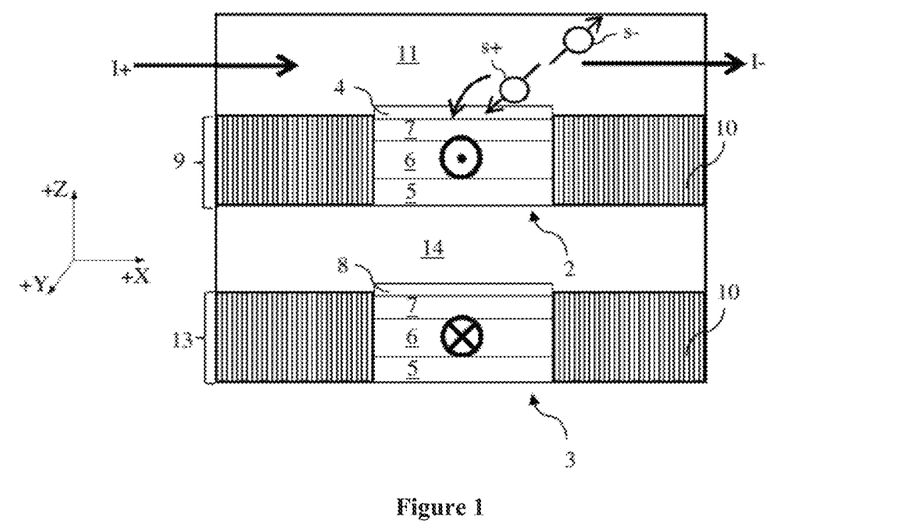
FIG. 1. Magnetic bits inside a memory device.

FIG. 1 shows a magnetic reference bit (2) and a magnetic storage bit (3) inside the magnetic memory device (1) along with a reference layer (9) and a storage layer (13). The reference layer (9) consists of a high spin-orbit coupling, high spin-hall angle metal electrode layer (4) (a heavy metal like Tantalum (Ta) or Platinum (Pt)) deposited on top of the reference layer (9) which has magnetic reference bits (2) isolated by a non-magnetic insulation material (10) such as Silicon Dioxide ($SiO_2$). The storage layer (13) has a metal electrode layer (8) that is a material with long spin-diffusion length such as Copper (Cu) and magnetic storage bits (3) separated by an insulation material (10).

The magnetic reference bits (2) and the magnetic storage bits (3) are formed of magnetic nano-pillars in sub-micron dimensions such as a stack of a bottom layer (5) of high spin polarization ferromagnetic material in contact with an intermediate layer (6) of soft ferromagnet capped with a top layer (7) of high spin polarization ferromagnetic material. An example for the magnetic nano-pillars in the reference layer (9) is CoFeB/$Ni_{81}Fe_{19}$/CoFeB (cobalt-iron-boron alloy/nickel-iron alloy/cobalt-iron-boron alloy) that is capped with a heavy metal electrode layer (4) that is the same material (a high spin-hall angle metal) as the reference electrode (11). Other examples are for high spin polarization ferromagnetic metal Half-metallic Heusler alloys can be used and NiFeCu, FeSi and similar alloys of NiFe can be used for the soft magnetic layer. The magnetic storage bits (3) are formed of the same materials as the magnetic reference bits (2). The magnetic bits are patterned into nano-pillars and can be designed in elliptical shape with the long axis defining the easy axis of the magnetic film.

In the present invention, the information is written into the magnetic storage bits (3) with respect to the reference layers (9) and the information in the magnetic storage bits (3) is determined by the magnetization direction of the soft magnetic material in the magnetic nano-pillars.

A method for writing into a magnetic storage bit (3) "1" (that is magnetization in the magnetic storage bit (3) along +y direction) using the magnetic memory device (1) and a control box (16), the method comprising the steps of;

selecting an writing metal electrode (14) in contact with a magnetic storage bit (3) to be changed, and a reference electrode (11) in contact with a magnetic reference bit (2) having a fixed magnetization direction along +y direction and disposed on top of the magnetic storage bit (3), passing a current pulse from the writing metal electrode (14) through the magnetic reference bit (2) to the reference electrode (11), wherein spins of the current polarized by the magnetic reference bit (2) diffuse into the writing metal electrode (14) towards the magnetic storage bit (3) and impose a magnetization in the magnetic storage bit (3) along the same direction with the spins.

Before writing the information into the magnetic storage bit (3), first, the reference layers (9) is initialized (for once), i.e. the magnetic reference bit (2) magnetization is initialized by passing a current through the reference electrode (11) (a heavy metal such as Ta, Pt) via a control box (16). For a negative spin hall angle material like Ta, a current towards +x direction (from left to right) as in FIG. 1 creates a pure spin current traveling towards the magnetic reference bit (2) (along −z direction) that is spin polarized along +y direction. This current imposes a magnetization in the magnetic reference bit (2) along +y direction which is addressed as the "1" bit. For a positive spin hall angle material like Pt, a current towards −x direction creates a pure spin current traveling towards the magnetic reference bit (2) (along −z direction) that is spin polarized along +y direction. This current imposes a magnetization in the magnetic reference bit (2) along +y direction which is addressed as the "1" bit.

Figure 2A:
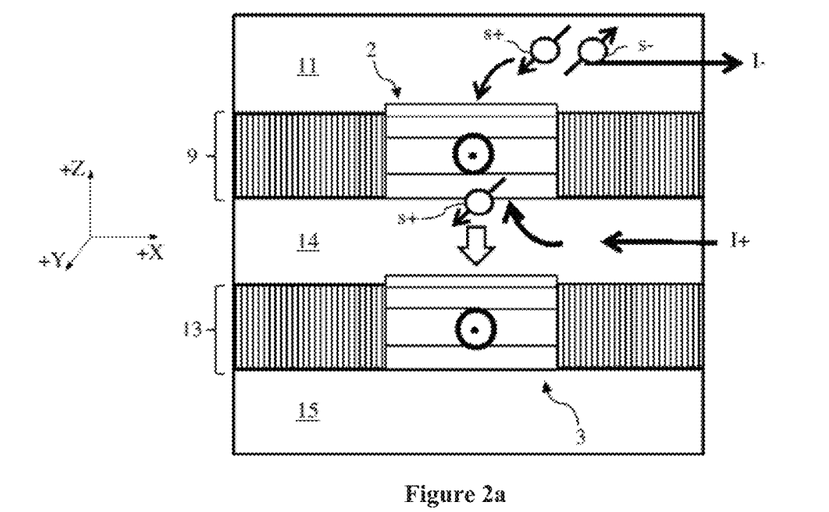
FIG. 2a and FIG. 2b. Demonstration of write operation.
Figure 2B:
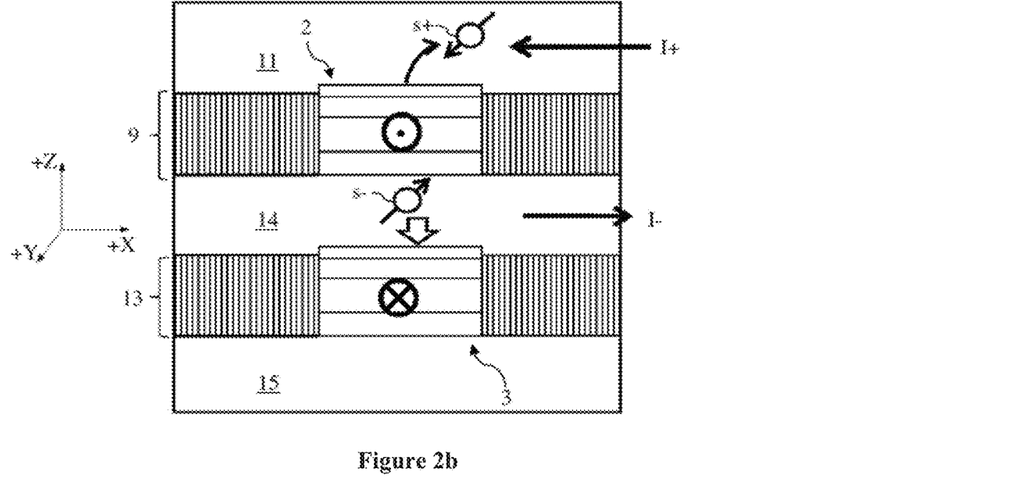

The information flow from the reference layer (9) to the magnetic storage bits (3) is achieved using non-local injection of pure spin currents as illustrated in FIG. 2a and FIG. 2b. The state of the magnetic storage bit (3) is determined by the direction of the current that passes through the magnetic reference bit (2). When the current pulse flows from the writing metal electrode (14) (Cu), through the device (towards +z) to the reference electrode (11) (Ta) the spins that are polarized by the magnetic reference bit (2) diffuse into the writing metal electrode (14) (Cu) towards the magnetic storage bit (3) (along −z) and impose a magnetization in the magnetic storage bit (3) along +y direction, and the magnetic storage bit (3) is written as "1".

A method for writing into a magnetic storage bit (3) "0" (that is magnetization in the magnetic storage bit (3) along −y direction) using the magnetic memory device (1) disclosed above and a control box (16), the method comprising the steps of;

selecting an writing metal electrode (14) in contact with a magnetic storage bit (3) to be changed and a reference electrode (11) in contact with a magnetic reference bit (3) disposed on top of the magnetic storage bit (3), where the direction of magnetic reference bit (2) is fixed along +y direction, passing a current pulse from the reference electrode (11) through the magnetic reference bit (2) to the writing metal electrode (14), wherein spins of the current that are polarized in the opposite direction with the magnetic reference bit (2) are scattered off the magnetic reference bit (2) towards the magnetic storage bit (3) and impose a magnetization in the magnetic storage bit (3) along the same direction with the spins.

To be able to write "0" which is magnetization in the magnetic storage bit (3) along −y direction (in-plane direction), first the magnetic reference bit (2) is initialized as disclosed above (if the magnetic reference bit (2) is initialized before, this step will be passed). After initialization of the magnetic reference bit (2), a current pulse generated by the control box (16) is passed from the reference electrode (11), Ta layer, towards the writing metal electrode (14), Cu layer, (towards −z through the magnetic reference bit (2)) the spins that are polarized along −y direction are scattered off the magnetic reference bit (2) and they move towards the magnetic storage bit (3) along −z direction and switch the magnetization of the magnetic storage bit (3) towards −y direction.

A method for reading out information of a magnetic storage bit (3) using the magnetic memory device (1) and a control box (16), the method comprising the steps of;
  selecting a reading metal electrode (15) in contact with a magnetic storage bit (3) to be read out and a reference electrode (11) in contact with a magnetic reference bit (2) disposed on top of the magnetic storage bit (3).
  passing a current pulse from the reference electrode (11) to the reading metal electrode where the current yields a high or a low resistance value depending on the relative orientation of the magnetic reference bits (2) and magnetic storage bits (3),
  detecting resistance of the resistance of the magnetic bits, determining the binary state of each memory element based on the resistance of the magnetic bits by comparing the resistance with a predetermined value if the resistance is higher or lower than the value and;
    if the resistance is lower than the value, detecting information on the magnetic storage bit (3) as "1",
    if the resistance is higher than the value, detecting information on the magnetic storage bit (3) as "0".

Figure 3:
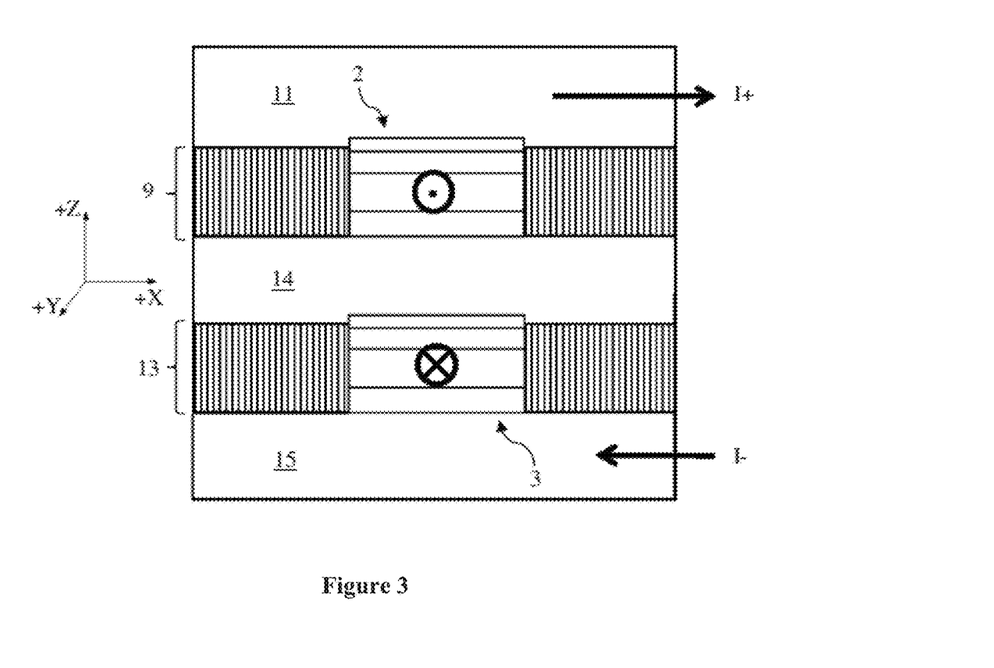
FIG. 3. Demonstration of read operation.
Figure 4:
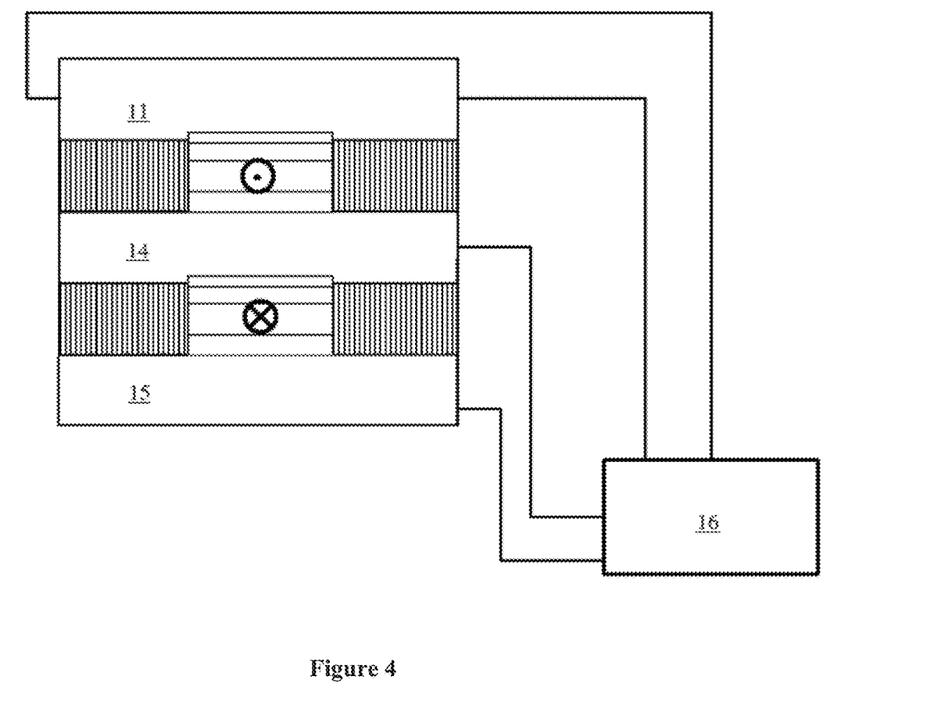
FIG. 4. Demonstration of reset, read and write operations using a control box.

A read operation is performed, i.e. the state of the magnetic storage bits (3) is detected by Giant Magneto Resistance (GMR) effect because the reference layer (9) together with the storage layer (13) creates a spin-valve structure. Reading the electrical resistance of the magnetic bits via control box (16) while passing a current pulse through the magnetic reference bit (2) and the magnetic storage bit (3) (hence the current generated by the control box (16) runs from the reference electrode (11), Ta, to the reading metal electrode (15), Cu, or vice versa) as demonstrated in FIG. 3 yields a high or a low resistance value depending on the relative orientation of the magnetic reference bits (2) and magnetic storage bits (3). For example, if the two bits (a magnetic reference bits (2) and a magnetic storage bit (3)) are parallel to each other this means that the state of the magnetic storage bit (3) is a "1" and a low resistance is detected via the control box (16) (such as a sensing circuit) by comparing the detected resistance with a reference value stored in a memory in the control box (16). If the resistance of the bits is high (which means the detected resistance value is higher than the reference value stored in the memory) then the magnetic storage bit (3) magnetization is opposite to the magnetic reference bit (2) magnetization and the information stored in the magnetic storage bit (3) is detected as "0".

Figure 5:
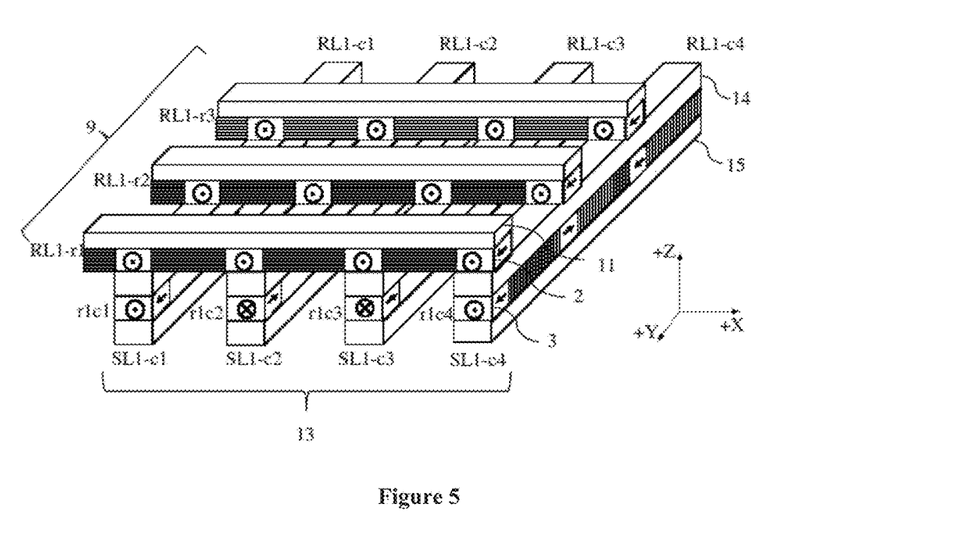
FIG. 5. Array demonstration of the magnetic device, wherein RLm-ri represent the $m^{th}$ reference layer $i^{th}$ row, RLm-cj represent the $m^{th}$ reference layer $j^{th}$ column, SL-cj represent the $j^{th}$ columns of the writing metal electrodes below the storage bits, and SLn-ricj represent a storage bit in the $n^{th}$ storage layer, at the intersection of $i^{th}$ reference layer row and $j^{th}$ storage layer column.

A three dimensional sketch of the present invention is illustrated in FIG. 5 showing arrays of magnetic bits, reference and storage, along with the electrode orientations. One layer of horizontal arrays of reference electrodes (11), with arrays of magnetic reference bits (2) located underneath, define the reference layer (9), RL. The reference electrodes (11) which are made of a high spin-hall angle material are arranged so that they form lines on top of the magnetic reference bits (2) running along +x direction, each labeled as RL1-ri, i being the row number. The storage layer (13), consists of columns of writing metal electrodes (14) with labels SL1-cj, j being the column number, aligned along +y direction with arrays of magnetic storage bits (3) above them. Magnetic storage bits (3) in storage layer (13), are arranged so that each bit is positioned below a magnetic reference bit (2) which is used as a reference to read or write information. In this design each bit is individually accessible through the proper choice of reference electrodes (11), writing metal electrodes (14) and reading metal electrodes (15) and the bits labeled ricj with the corresponding electrode row and column numbers. For example, to access bit r1c2 on the first storage layer (13), the reference electrode (11) of RL1-r1 and the bottom electrode (15) of SL1-c2 are selected by the control box (16) in an electronic device (such as a computer or intelligent device like phone, tablet PC . . . ) connected to a power source, and a read current pulse created by the control box (16) is passed through these electrodes to read the bit. To write this bit, a current pulse is sent through the electrodes RL1-r1 and RL1-c2.

Figure 6:
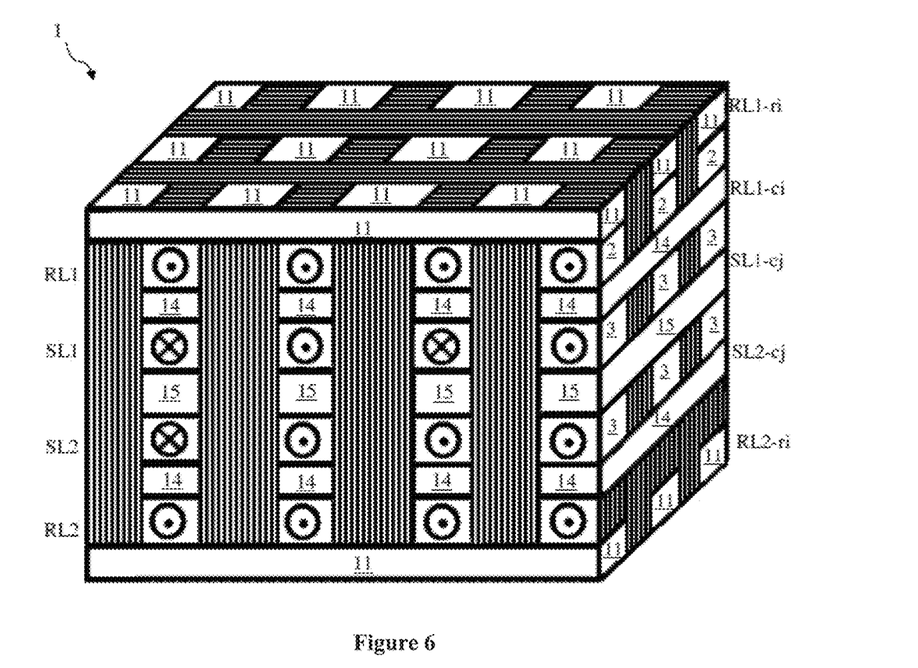
FIG. 6. A box like schematic of the device with two reference layers and two storage layers.
Figure 7:
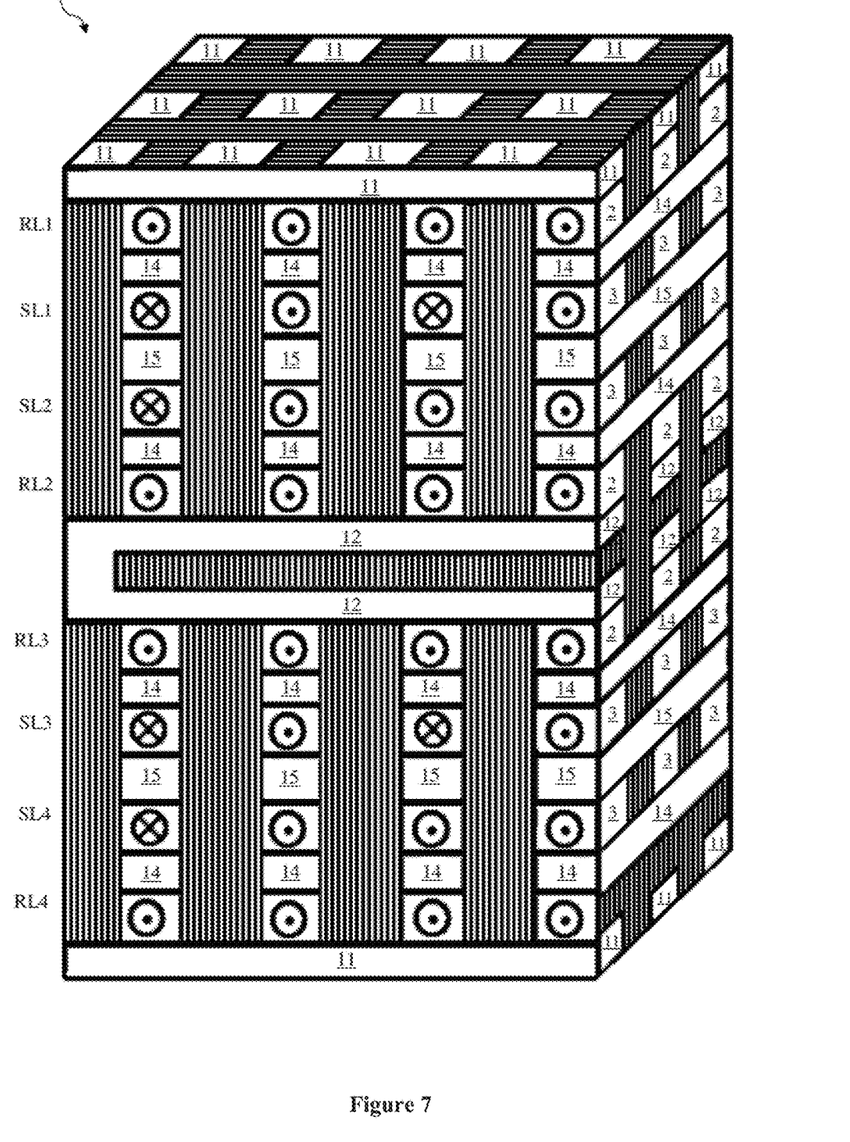
FIG. 7. A repeating stack for a 3D memory design.

A box-like schematic of the same magnetic memory device (1) (of FIG. 5) is shown in FIG. 6 with two reference layers (9) and storage layers (13). This drawing forms the basis for a repeatable stack that is illustrated in FIG. 7. Similarly, a second storage layer (13), SL2, is placed under a first storage layer (13), SL1, with columns of electrodes and bit arrays.

FIG. 6 illustrates stacking of multiple storage layers (13). In this two storage layer (13) demonstration of FIG. 6, each storage layer (13) has a corresponding reference layer (9). To demonstrate the write and read operations in this design, the following examples are provided:
  Operation: Write "0" to the bit r1c1 of SL1;
    Initialize the reference bit r1c1 by passing a current through RL1-r1 (towards the right)
    Pass a write current pulse from RL1-r1 towards RL1-c1.
  Operation: Write "1" to the bit r2c4 of SL1;
    Initialize the reference bit r2c4 by passing a current through RL1-r2 (towards the right)
    Pass a write current pulse from RL1-c4 towards RL1-r2
  Operation: Write "1" to the bit SL2-r1-c4;
    Initialize RL2 by passing current through RL2-r1 towards the left
    Pass a write current pulse from SL2-c4 towards RL2-r1.
  Operation: Read the bit SL1-r1c3;
    Pass a read current pulse from RL1-r1 to SL1-c3
  Operation: Read the bit SL2-r1c3;
    Pass a read current from RL2-r1 to SL1-c3

In one embodiment of the present invention, the stack of two storage layers (13) shown in FIG. 6 can be repeated to achieve more than two storage layers (13). In this embodiment, each stack is connected on top of another stack where the reference layers (9) positioned on top and bottom of the two adjacent stacks connected to each other are isolated by an insulation material (10) (such as $SiO_2$). The storage layers (13) with odd numbers can be written or read similar to first storage layer (13), SL1, and the storage layers (13) with even numbers can be written or read similar to second storage layer (13), SL2 disclosed above.

In a preferred embodiment of the present invention, the stack of two storage layers (13) shown in FIG. 6 can be repeated as demonstrated in FIG. 7 to achieve more than two storage layers (13). The design also involves a connected electrode system for second reference layer (9), RL2, and third reference layer (9), RL3. In this embodiment, an upper stack is connected to another stack (or more stacks) positioned under the upper stack through arrays of common reference electrodes (12) formed by connecting one of two terminals of the reference electrodes (11) placed on bottom of the upper stack with one of two terminals of the reference electrodes (11) placed on top of the other stack. A current pulse through RL3-r1 towards the left, for instance, that goes up at the intersection and towards the right through RL2-r1 can initialize both the second reference layer (9), RL2, and the third reference layer (9), RL3.

What is claimed is:

1. A three-dimensional magnetic memory device, comprising;
a plurality of magnetic reference bits formed of a plurality of magnetic nano-pillars, wherein each of the plurality of magnetic nano-pillars is capped with a high spin-hall angle heavy metal electrode layer, each of the plurality of magnetic nano-pillars includes a bottom layer of high spin polarization ferromagnetic material, the bottom layer is in contact with an intermediate layer of soft ferromagnet, the intermediate layer is capped with a top layer of high spin polarization ferromagnetic material;
a plurality of magnetic storage bits formed of a plurality of magnetic nano-pillars in sub-micron dimensions, wherein each of the plurality of magnetic nano-pillars is capped with a long spin-diffusion length metal electrode layer, each of the plurality of magnetic nano-pillars includes a bottom layer of high spin polarization ferromagnetic material, the bottom layer is in contact with an intermediate layer of soft ferromagnet, the intermediate layer is capped with a top layer of high spin polarization ferromagnetic material; a plurality of stacks of two storage layers placed between two reference layers, wherein
the reference layers comprising:
a plurality of arrays of the magnetic reference bits wherein the magnetic reference bits are isolated by an insulation material from each other;
a plurality of arrays of reference electrodes in contact with the arrays of the magnetic reference bits;
the storage layers comprising:
a plurality of arrays of the magnetic storage bits perpendicular to the arrays of the magnetic reference bits, wherein the magnetic storage bits are isolated by the insulation material from each other:
a plurality of arrays of writing metal electrodes positioned between the reference layers and storage layers;
a plurality of arrays of reading metal electrodes in contact with the arrays of the magnetic storage bits.

2. The three-dimensional magnetic memory device according to claim 1, wherein the plurality of stacks are overlapped on each other, and each stack is insulated by a non-magnetic insulation material.

3. The three-dimensional magnetic memory device according to claim 2, wherein the plurality of stacks are connected to each other through arrays of common reference electrodes formed by connecting the reference electrodes placed on bottom of each stack with reference electrodes placed on top of another stack.

4. The three-dimensional magnetic memory device according to claim 1, wherein the top layer and the bottom layer is formed of cobalt iron boron alloy.

5. The three-dimensional magnetic memory device according to claim 1, wherein the intermediate layer is formed of nickel iron alloy.

6. The three-dimensional magnetic memory device according to claim 1, wherein the heavy metal electrode layer is a metal with high spin-hall angle.

7. The three dimensional magnetic memory device according to claim 6, wherein the reference electrode is the same metal with the heavy metal electrode layer.

8. The three-dimensional magnetic memory device according to claim 1, wherein high spin-hall angle metal electrode layer is a heavy metal selected from a group consisting of Tantalum and Platinum.

9. The three-dimensional magnetic memory device according to claim 1, wherein the insulation material is Silicon Dioxide.

10. The three-dimensional magnetic memory device according to claim 1, wherein the metal electrode layer is Copper.

11. A method for writing into a magnetic storage bit "1" using a magnetic memory device, wherein the magnetic memory device comprises
a plurality of magnetic reference bits formed of a plurality of magnetic nano-pillars, wherein each of the plurality of magnetic nano-pillars is capped with a high spin-hall angle heavy metal electrode layer, each of the plurality of magnetic nano-pillars includes a bottom layer of high spin polarization ferromagnetic material, the bottom layer is in contact with an intermediate layer of soft ferromagnet, the intermediate layer is capped with a top layer of high spin polarization ferromagnetic material;
a plurality of magnetic storage bits formed of a plurality of magnetic nano-pillars in sub-micron dimensions, wherein each of the plurality of magnetic nano-pillars is capped with a long spin-diffusion length metal electrode layer, each of the plurality of magnetic nano-pillars includes a bottom layer of high spin polarization ferromagnetic material, the bottom layer is in contact with an intermediate layer of soft ferromagnet, the intermediate layer is capped with a top layer of high spin polarization ferromagnetic material;
a plurality of stacks of two storage layers placed between two reference layers, wherein the reference layers comprising:
a plurality of arrays of the magnetic reference bits wherein the magnetic reference bits are isolated by an insulation material from each other;
a plurality of arrays of reference electrodes in contact with the arrays of the magnetic reference bits;
the storage layers comprising:
a plurality of arrays of the magnetic storage bits perpendicular to the arrays of the magnetic reference bits, wherein the magnetic storage bits are isolated by the insulation material from each other:
a plurality of arrays of writing metal electrodes positioned between the reference layers and storage layers;
a plurality of arrays of reading metal electrodes in contact with the arrays of the magnetic storage bits;
the method comprising the steps of:
selecting a writing metal electrode in contact with a magnetic storage bit to be changed, and a reference electrode in contact with a magnetic reference bit having a fixed magnetization direction and disposed on top of the magnetic storage bit,
passing a current pulse from the writing metal electrode through the magnetic reference bit to the reference electrode, wherein spins of a current polarized by the magnetic reference bit diffuse into the writing metal electrode towards the magnetic storage bit and imposing a magnetization in the magnetic storage bit along the same direction with the spins.

12. A method for writing into a magnetic storage bit "0" using a magnetic memory device, wherein the magnetic memory device comprises a plurality of magnetic reference bits formed of a plurality of magnetic nano-pillars, wherein each of the plurality of magnetic nano-pillars is capped with a high spin-hall angle heavy metal electrode layer, each of the plurality of magnetic nano-pillars includes a bottom layer of high spin polarization ferromagnetic material, the bottom layer is in contact with an intermediate layer of soft ferromagnet, the intermediate layer is capped with a top layer of high spin polarization ferromagnetic material;

a plurality of magnetic storage bits formed of a plurality of magnetic nano-pillars in sub-micron dimensions, wherein each of the plurality of magnetic nano-pillars is capped with a long spin-diffusion length metal electrode layer, each of the plurality of magnetic nano-pillars includes a bottom layer of high spin polarization ferromagnetic material, the bottom layer is in contact with an intermediate layer of soft ferromagnet, the intermediate layer is capped with a top layer of high spin polarization ferromagnetic material;

a plurality of stacks of two storage layers placed between two reference layers, wherein the reference layers comprising:
    a plurality of arrays of the magnetic reference bits wherein the magnetic reference bits are isolated by an insulation material from each other;
    a plurality of arrays of reference electrodes in contact with the arrays of the magnetic reference bits;

the storage layers comprising:
    a plurality of arrays of the magnetic storage bits perpendicular to the arrays of the magnetic reference bits, wherein the magnetic storage bits are isolated by the insulation material from each other:
    a plurality of arrays of writing metal electrodes positioned between the reference layers and storage layers;
    a plurality of arrays of reading metal electrodes in contact with the arrays of the magnetic storage bits;

the method comprising the steps of:
selecting a writing metal electrode in contact with a magnetic storage bit to be changed and a reference electrode in contact with a magnetic reference bit disposed on top of the magnetic storage bit having a fixed magnetization direction, passing a current pulse from the reference electrode through the magnetic reference bit to the writing metal electrode, wherein spins of a current that are polarized in the opposite direction with the magnetic reference bit are scattered off the magnetic reference bit towards the magnetic storage bit and impose a magnetization in the magnetic storage bit along the same direction with the spins.

13. The methods according to claim 11, wherein the direction of magnetic reference bit is fixed by passing a current pulse through the reference electrode wherein the current pulse creates a pure spin current travelling towards the magnetic reference bits and transferring an angular momentum to the magnetic reference bit.

14. A method for reading out information of a magnetic storage bit using the magnetic memory device, wherein the magnetic memory device comprises a plurality of magnetic reference bits formed of a plurality of magnetic nano-pillars, wherein each of the plurality of magnetic nano-pillars is capped with a high spin-hall angle heavy metal electrode layer, each of the plurality of magnetic nano-pillars includes a bottom layer of high spin polarization ferromagnetic material, the bottom layer is in contact with an intermediate layer of soft ferromagnet, the intermediate layer is capped with a top layer of high spin polarization ferromagnetic material;

a plurality of magnetic storage bits formed of a plurality of magnetic nano-pillars in sub-micron dimensions, wherein each of the plurality of magnetic nano-pillars is capped with a long spin-diffusion length metal electrode layer, each of the plurality of magnetic nano-pillars includes a bottom layer of high spin polarization ferromagnetic material, the bottom layer is in contact with an intermediate layer of soft ferromagnet, the intermediate layer is capped with a top layer of high spin polarization ferromagnetic material;

a plurality of stacks of two storage layers placed between two reference layers, wherein the reference layers comprising:
    a plurality of arrays of the magnetic reference bits wherein the magnetic reference bits are isolated by an insulation material from each other;
    a plurality of arrays of reference electrodes in contact with the arrays of the magnetic reference bits;

the storage layers comprising:
    a plurality of arrays of the magnetic storage bits perpendicular to the arrays of the magnetic reference bits, wherein the magnetic storage bits are isolated by the insulation material from each other:
    a plurality of arrays of writing metal electrodes positioned between the reference layers and storage layers;
    a plurality of arrays of reading metal electrodes in contact with the arrays of the magnetic storage bits;

the method comprising the steps of:
selecting a reading metal electrode in contact with a magnetic storage bit to be read out and a reference electrode in contact with a magnetic reference bit disposed on top of the magnetic storage bit, passing a current pulse from the reference electrode to the reading metal electrode wherein the current pulse yields a high or a low resistance value depending on the relative orientation of the magnetic reference bits and magnetic storage bits, detecting resistance of the magnetic bits, determining a binary state of each memory element by comparing the resistance with a predetermined reference value if the resistance is higher or lower than the reference value and;

if the resistance is lower than the reference value, determining information on the magnetic storage bit as "1", if the resistance is higher than the reference value, determining information on the magnetic storage bit as "0".

15. The three-dimensional magnetic memory device according to claim 2, wherein the top layer and the bottom layer is formed of cobalt iron boron alloy.

16. The three-dimensional magnetic memory device according to claim 2, wherein the intermediate layer is formed of nickel iron alloy.

17. The three-dimensional magnetic memory device according to claim 2, wherein the heavy metal electrode layer is a metal with high spin-hall angle.

18. The three-dimensional magnetic memory device according to claim 2, wherein high spin-hall angle metal electrode layer is a heavy metal selected from a group consisting of Tantalum and Platinum.

19. The three-dimensional magnetic memory device according to claim 2, wherein the insulation material is Silicon Dioxide.

20. The three-dimensional magnetic memory device according to claim 2, wherein the metal electrode layer is Copper.

\* \* \* \* \*